US006912598B1

(12) United States Patent
Bedarida et al.

(10) Patent No.: US 6,912,598 B1
(45) Date of Patent: Jun. 28, 2005

(54) NON-VOLATILE MEMORY WITH FUNCTIONAL CAPABILITY OF SIMULTANEOUS MODIFICATION OF THE CONTENT AND BURST MODE READ OR PAGE MODE READ

(75) Inventors: Lorenzo Bedarida, Milan (IT); Antonino Geraci, Milan (IT); Mauro Sali, Lodi (IT); Simone Bartoli, Milan (IT)

(73) Assignee: STMicroelectrics S.r.l., Agrate Brianza (IT)

( * ) Notice: Subject to any disclaimer, the term of this patent is extended or adjusted under 35 U.S.C. 154(b) by 725 days.

(21) Appl. No.: 09/627,703

(22) Filed: Jul. 28, 2000

(30) Foreign Application Priority Data

Jul. 30, 1999 (EP) ........................................... 99830495

(51) Int. Cl.[7] ........................... G06F 9/28; G06F 13/16

(52) U.S. Cl. ..................... 710/7; 710/3; 710/5; 710/14; 710/20; 710/21; 710/35; 710/36; 710/53; 711/150; 711/168; 711/5; 365/189.04; 365/230.03

(58) Field of Search ............................. 710/3, 7, 5, 14, 710/20, 21, 23, 25, 31, 35, 36, 38, 53, 58; 711/5, 150, 168, 109; 365/206, 189.04, 230.03, 185.33

(56) References Cited

U.S. PATENT DOCUMENTS

| | | | | |
|---|---|---|---|---|
| 5,263,003 A | * | 11/1993 | Cowles et al. | 365/230.03 |
| 5,371,877 A | * | 12/1994 | Drako et al. | 711/109 |
| 5,847,998 A | * | 12/1998 | Van Buskirk | 365/185.33 |
| 5,867,430 A | * | 2/1999 | Chen et al. | 365/189.04 |
| 6,178,129 B1 | * | 1/2001 | Chen | 365/206 |

FOREIGN PATENT DOCUMENTS

| | | | |
|---|---|---|---|
| JP | 09106669 A | * | 4/1997 |
| WO | WO 99/35650 | | 7/1999 |

* cited by examiner

*Primary Examiner*—B. James Peikari
(74) *Attorney, Agent, or Firm*—Lisa K. Jorgenson; Robert Iannucci; Seed IP Law Group PLLC

(57) ABSTRACT

An electrically alterable semiconductor memory comprises at least two substantially independent memory banks, and a first control circuit for controlling operations of electrical alteration of the content of the memory. The first control circuit permits the selective execution of an operation of electrical alteration of the content of one of the at least two memory banks. The memory also comprises second control circuit that permits, simultaneously with said operation of electrical alteration of the content of one of the at least two memory banks, a burst mode, page mode, or standard read operation for reading the content of the other memory bank.

15 Claims, 4 Drawing Sheets

NON-VOLATILE MEMORY WITH FUNCTIONAL CAPABILITY OF SIMULTANEOUS MODIFICATION OF THE CONTENT AND BURST MODE READ OR PAGE MODE READ

TECHNICAL FIELD

The present invention relates to the field of semiconductor memories, in particular non-volatile memories, and still more particularly memories the content of which is electrically alterable (programmable or both programmable and erasable), such as EPROMs, EEPROMs and Flash EEPROMs.

BACKGROUND OF THE INVENTION

A normal read operation (hereinafter, standard read) in a memory provides for supplying to the memory an address which identifies a corresponding location of the memory. After a specific time interval has elapsed, termed access time, the datum stored in said location is available at the output of the memory.

Memories are known in which, besides the standard reading operation, it is possible to carry out a page mode read operation which, in the case where only the less significant bits of the address supplied at the input of the memory vary, makes it possible to obtain valid data at the output of the memory in a shorter time than the standard access time.

Other known memories, however, in addition to the possibility of carrying out a standard read, have the possibility of carrying out a burst mode read. By supplying to the memory an external clock signal and an address corresponding to an initial memory location, the memory internally increments the address automatically and delivers at the output new data corresponding to the successive memory addresses at each cycle of the clock signal. This read mode makes it possible to reduce the access time significantly in all those cases where, instead of accessing memory locations distributed randomly in the memory space, it is necessary to access a certain number of contiguous memory locations.

Also known are electrically programmable and erasable non-volatile memories having a possibility of simultaneous operation in erasure or programming (more generally in the mode of modification of their content), and in read. This functional capability is obtained by means of subdivision of the memory into two independent banks, such that while in one of the two memory banks a programming or erasure operation is carried out in the background, it is possible to carry out a simultaneous read operation in the other memory bank. The read is however a standard type read, therefore does not benefit from the possibilities of a reduction in the access time offered by the two particular read modes described previously. Rapid access to the memory with a burst mode read or page mode read is permitted only on completion of the background programming or erasure of the other bank, or, in memories which provide it, by temporarily suspending the background operation.

SUMMARY OF THE INVENTION

An embodiment of the present invention provides a memory that has the functional capability of simultaneous modification of its own content and burst mode read or page mode read. The memory includes two memory banks that are substantially independent of each other; a first control circuit that controls operations of electrical alteration of content of the memory and permits the selective execution of an operation of electrical alteration of the content of a first one of the two memory banks; and a second control circuit that permits, simultaneously with said operation of electrical alteration of content of one of said two memory banks, a burst mode, page mode, or standard read operation of content of the other memory bank. In one embodiment, the memory also includes respective scanning circuits for the memory bank. Each scanning circuit scans memory locations of the corresponding memory bank in order to allow plural memory locations of one memory bank to be read in parallel while plural memory locations of the other memory bank are written to or erased in parallel.

DETAILED DESCRIPTION OF THE INVENTION

The features and advantages of the present invention will become clear from the following detailed description of one of its embodiments, illustrated by way of non-limiting example in the appended drawings, in which.

DETAILED DESCRIPTION OF THE INVENTION

With reference to the drawings, a non-volatile memory 1 with electrically alterable content, for example an EPROM, or EEPROM, or Flash EEPROM memory, comprises two independent memory banks 1A, 1B, of either the same size or different sizes. The two memory banks 1A, 1B respectively have associated circuits (SEL) 9A, 9B for selection of memory locations of the respective memory banks, and respective read ("sense") circuits S1A, S1B for reading the memory locations of the respective banks.

A block 10 identifies a control logic circuit internal to the memory 1. The block 10 receives external address signals ADD from an address signal bus external to the memory 1, DAT signals from a data bus also external to the memory 1, an external signal CEN (Chip Enable) for enabling the memory 1, an external signal OEN (Output Enable) for enabling output circuits 11 of the memory 1, an external signal WEN for controlling an operation of modification of the content of the memory 1 (Write Enable), an external clock signal CK, and an external signal AD which is activated externally, for example by a microprocessor which manages the memory 1, when a new address valid for the memory 1 is present at the address bus.

Figure 2:
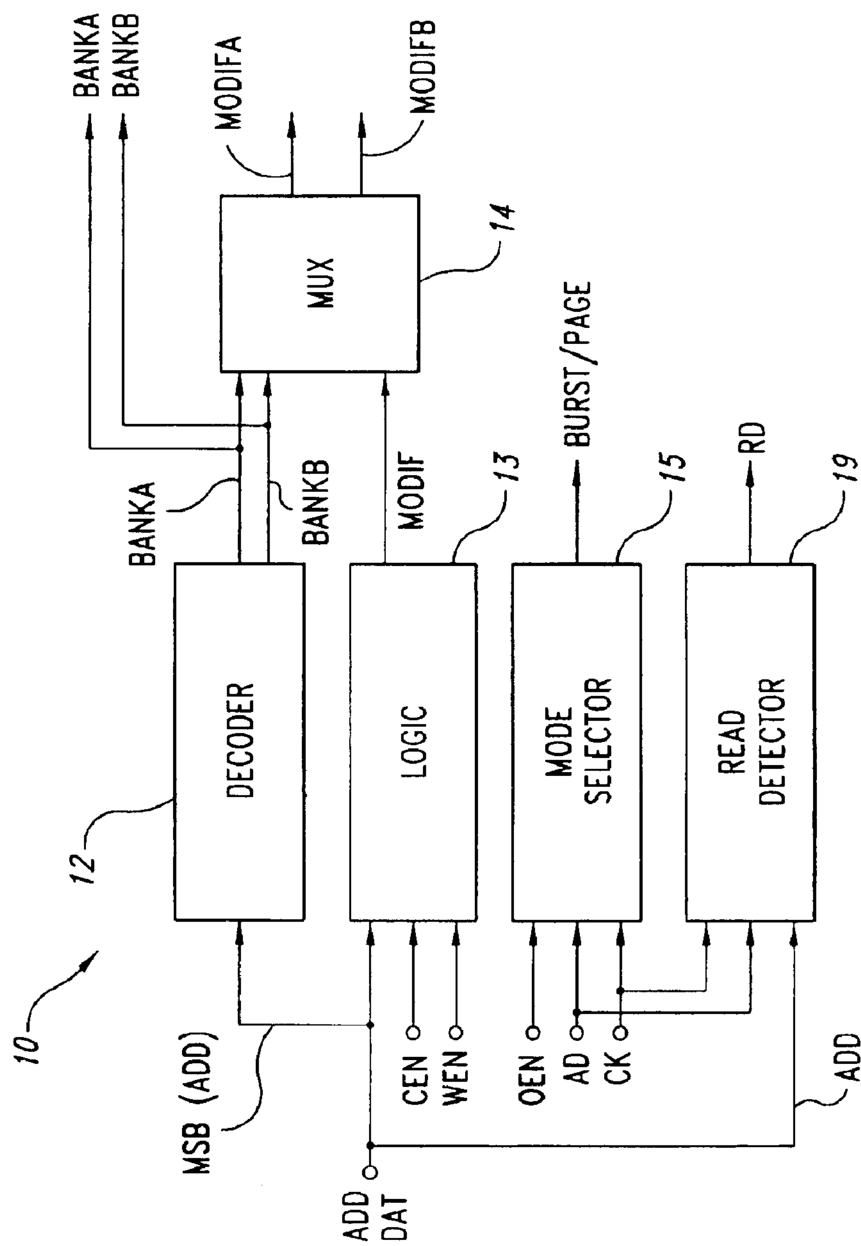
FIG. 2 is a block diagram of a logic circuit for controlling the memory in FIG. 1.

As shown in greater detail in FIG. 2, the control logic circuit 10 comprises a decoder 12 which receives a subset MSB(ADD) of the external address signals ADD; the subset MSB(ADD) comprises the more significant bits of the set of bits constituting the external address supplied to the memory 1. The decoder 12 decodes the signals MSB(ADD) and generates signals BANKA, BANKB for selection of the memory banks 1A, 1B, which identify which of the two memory banks is to be accessed.

The signals CEN, WEN, the external address signals ADD and the signals of the data bus DAT are supplied to a logic circuit 13 for the interface and interpretation of external commands, for example produced by means of a PLA (Programmable Logic Array). The logic circuit 13 interprets the sequences of commands which are presented to it by means of the signals ADD and DAT and, in response to the fact that the memory is enabled (CEN signal active) and that the content thereof is to be modified (or is brought into "write mode" by activation of the signal WEN), activates a signal MODIF.

The MODIF signal is supplied, together with the signals BANKA, BANKB, to a multiplexer 14 which generates two signals MODIFA, MODIFB. The signals MODIFA, MODIFB are activated to indicate that the respective memory banks 1A, 1B are to be subjected to an operation of modification of their content.

The control logic circuit 10 further comprises a block 15 revealing the burst read or page read mode. The block 15 receives the signals OEN, AD and CK. If the clock signal CK is present, the activation of the signal AD determines the activation of the signal BURST/PAGE which in turn determines the entry into the burst read or page read mode.

The control logic circuit 10 also comprises a read revealing block 19, which receives the signals ADD, CK and AD and generates a signal RD which, if active, indicates that a read should be carried out. The signal RD is activated when the external clock signal CK is absent.

Returning to FIG. 1, a block 2 identifies a circuit for controlling the electrical alteration of the content of the memory 1, for example, in the case of a Flash EEPROM memory, of the programming and erasure operations. The circuit 2 receives the signals MODIFA and MODIFB, which, as has been seen, are activated when, a content modification operation is to be conducted on the bank 1A or, respectively, on the bank 1B.

The circuit 2 has two (groups of) output signals 3A, 3B which respectively control a first address counter 4A and a second address counter 4B. The address counter 4A, associated with the memory bank 1A, makes possible internal scanning of the addresses of the memory bank 1A, by supplying first internal address signals 5A to the respective selection circuit 9A. The address counter 4B is associated with the memory bank 1B and makes possible the internal scanning of the addresses of the memory bank 1B, by supplying second internal address signals 5B to the respective selection circuit 9B. The address counters 4A, 4B are used both during the operations of modification of the content, for example erasure, of the respective memory banks, and during the burst mode read operations, since in both cases the memory 1 should make provision autonomously for the scanning of a specific number of memory locations.

The address counter 4A further receives the signals MODIFA, BANKA and BURST/PAGE, and the address counter 4B receives the signals MODIFB, BANKB and BURST/PAGE. Both the address counters 4A, 4B further receive the address signals ADD.

A block 6 identifies a circuit for controlling the burst mode read or page mode read operations. The circuit 6 receives the signals BANKA, BANKB, MODIFA, MODIFB, BURST/PAGE, the external clock signal CK, the external signal AD, the signal RD and a subset LSB(ADD) of the address signals ADD which comprises the less significant bits of the address supplied to the memory 1. The block 6 supplies to the address counters 4*a*, 4*b* respective (groups of) control signals 7A, 7B, and further controls the read circuits S1A, S1B through respective (groups of) control signals 8A, 8B.

The outputs WORDA, WORDB of the read circuits S1A, S1B, each one bearing the content of a memory location of the respective bank, are supplied to a multiplexer 16 operated by the signals BANKA, BANKB. Depending on which of the two signals BANKA, BANKB is active, the circuit 16 supplies to the output circuits 11 one of the two outputs WORDA, WORDB of the read circuits. The output circuits 11 then supply the selected output WORDA, WORDB to the data bus DAT external to the memory 1.

The two control circuits 2 and 6, which respectively control the content alteration operation (programming or erasure), and the read operation (burst mode read or page mode read), operate simultaneously and can each control a respective memory bank.

Figure 3:
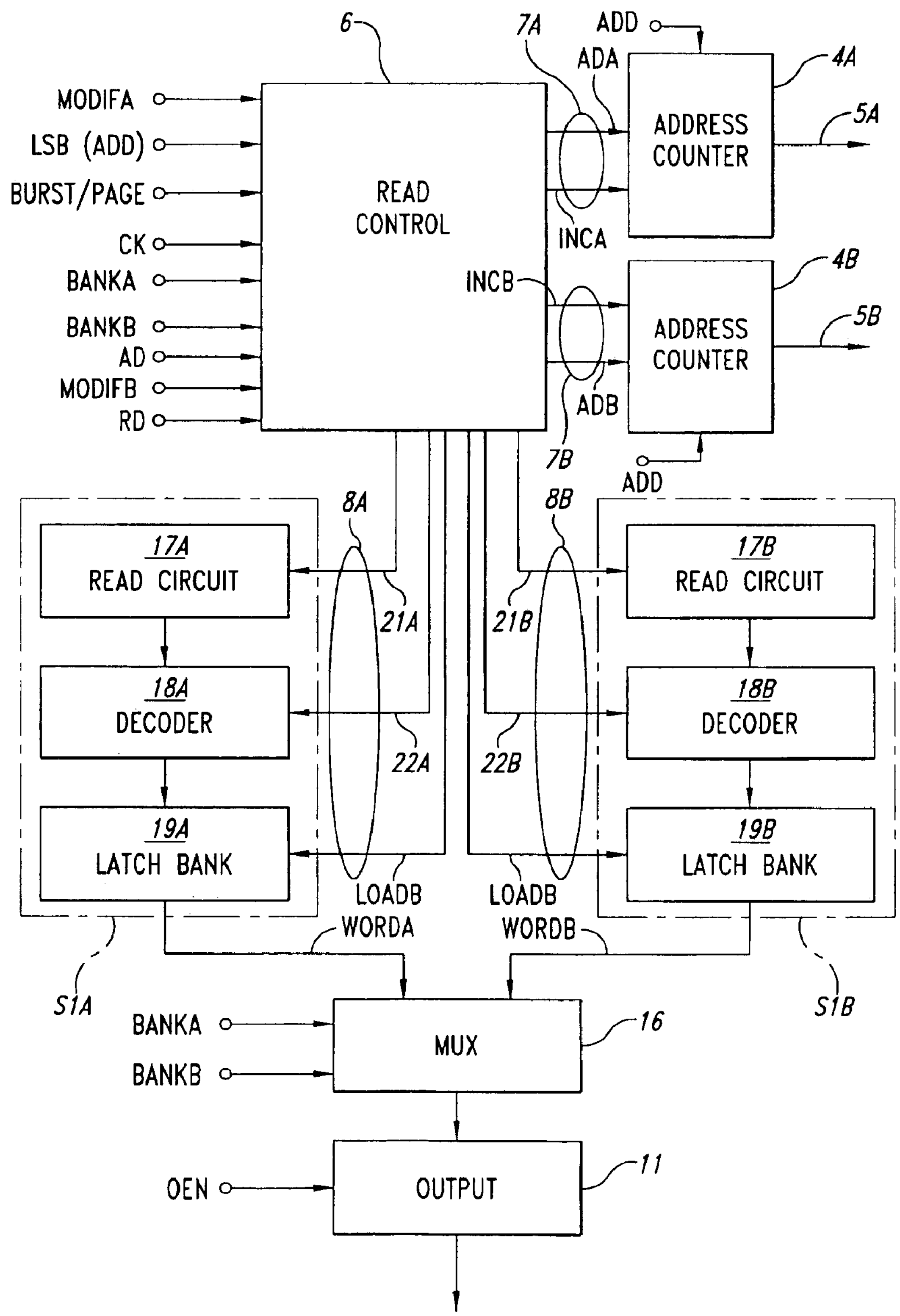
FIG. 3 is a more detailed block diagram of part of the memory in FIG. 1.

FIG. 3 shows in more detail, still in terms of a block diagram, the control operated by the block 6 on the address counters 4A, 4B and on the read circuits S1A, S1B, of which latter a more detailed illustration is also provided. The signals 7A, 7B respectively comprise a signal ADA, ADB which is activated by the circuit 6 so that the respective address counter 4A, 4B loads the address currently present on the address signals ADD, and a signal INCA, INCB which is activated to command the respective address counter 4A, 4B to increment the internal address 5A, 5B to be supplied to the selection circuits 9A, 9B of the memory banks.

Figure 1:
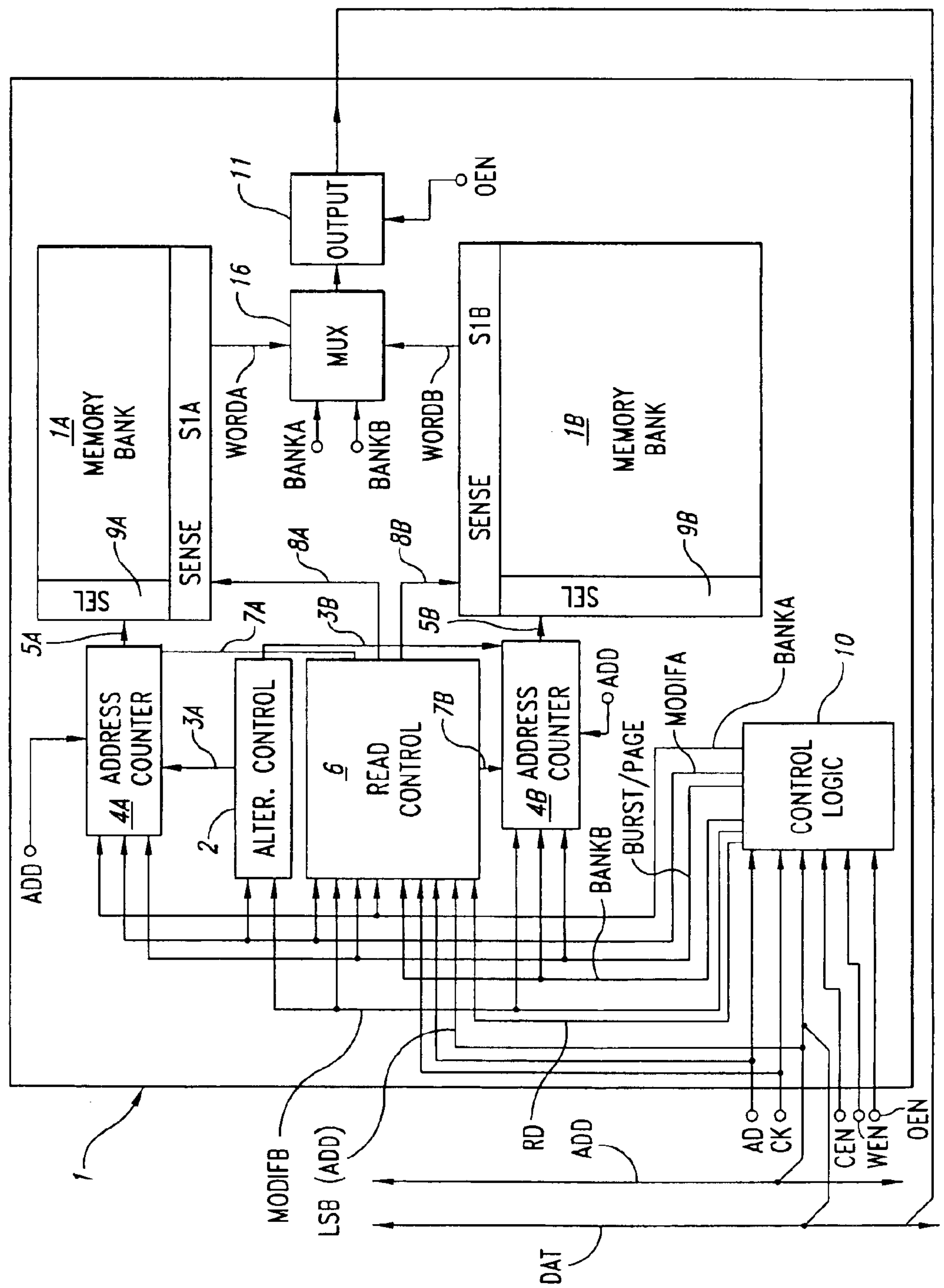
FIG. 1 shows diagrammatically, at the level of the principal functional blocks, a memory according to the present invention.

The read circuits S1A, S1B shown diagrammatically in FIG. 1 each comprise a plurality of actual read circuits 17A, 17B, of a type which is known per se, which provide for the reading in parallel of a respective plurality of locations in the respective memory banks 1A, 1B, for example four locations in parallel for each memory bank. The read circuits 17A, 17B receive from the block 6 signals 21A, 21B necessary for their operation, for example, signals for the starting of a phase of discharge of the selected bit lines, signals for the starting of a phase of pre-charge of the selected bit lines, and signals for storing of the data read. The outputs of the read circuits 17A, 17B are supplied to a decoder 18A, 18B which, on the command of a signal 22A, 22B supplied by the block 6, provides for selecting one of the outputs of the plurality of read circuits 17A, 17B, and for supplying said selected output to a latch bank 19A, 19B operated by a signal LOADA, LOADB supplied by the block 6. The latch outputs 19A, 19B form the signals WORDA, WORDB to be supplied to the multiplexer 16.

Figure 4:
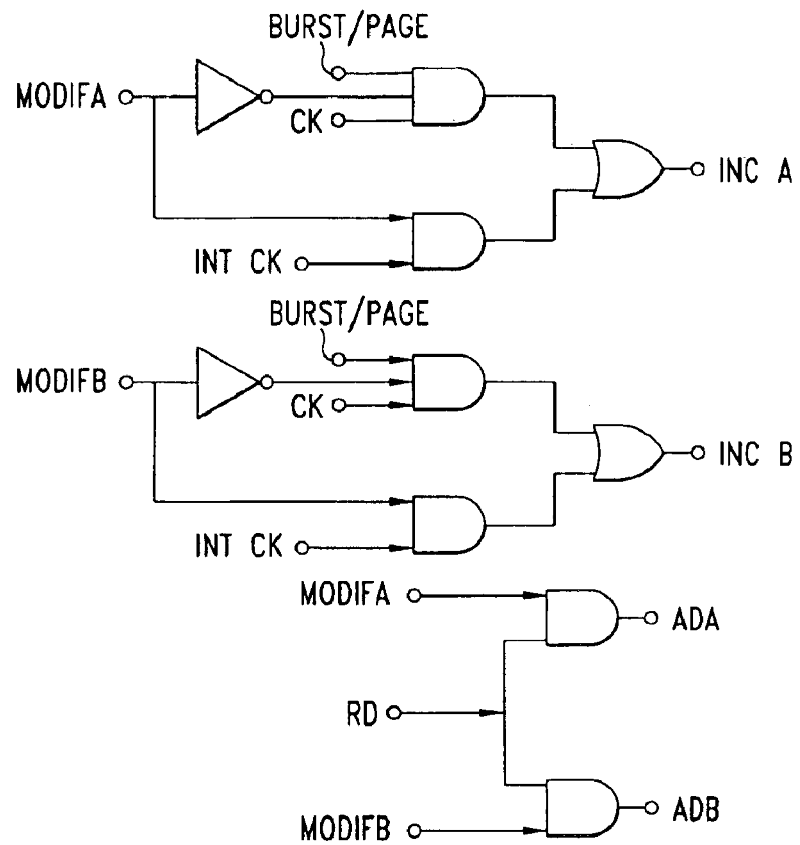
FIGS. 4 and 5 are simplified diagrammatic views, in terms of logic gates, of the operation of a circuit for controlling the operations of burst mode read or page mode read of the memory in FIG. 1.
Figure 5:
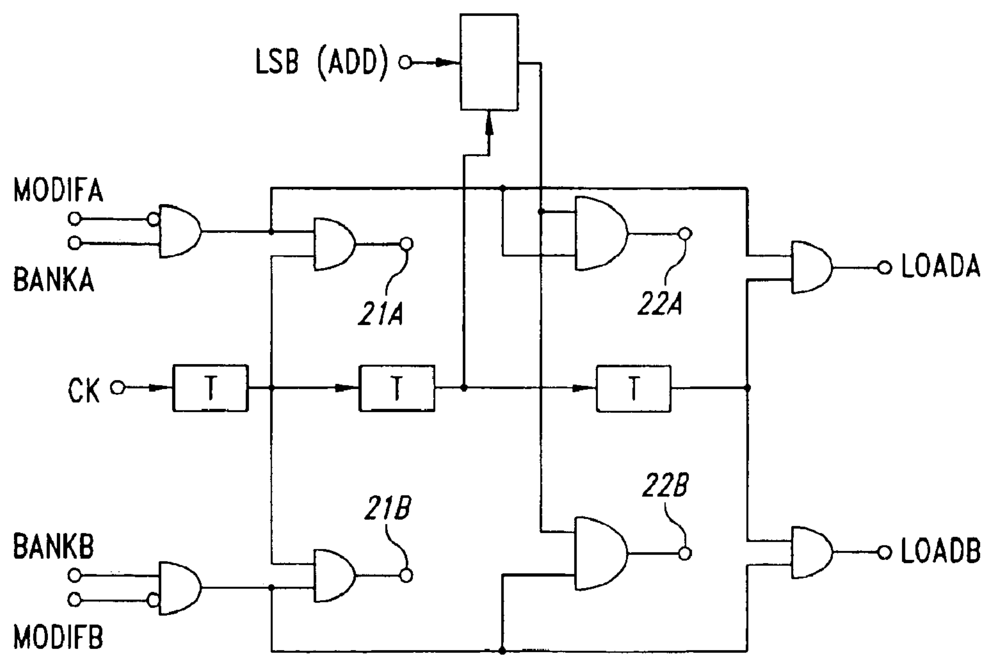

FIGS. 4 and 5 show diagrammatically, in terms of logic gates, the operation of the block 6. With reference to FIG. 4, the signal ADA is activated to cause the address counter 4A to load the address currently present on the signals ADD. The signal ADA is activated at the activation of the signal RD by the control logic circuit 10, or at the activation of the external signal AD (valid address at address bus ADD) by the microcontroller which manages the memory 1. The signal ADA is activated only if there is not an operation of modification of the content of the memory bank 1A taking place (signal MODIFA deactivated). The signal ADB is activated similarly, except that the signal MODIFB is used to signal that an operation of modification of the content of the memory bank 1B is taking place. In other words, apart from when a modification operation is taking place, in the event of any new read in the address counter 4A or 4B, the address present on the external address signals ADD is loaded.

The signal INCA, which determines the incrementation of the internal address 5A by the address counter 4A, is generated in synchrony with the external clock signal CK, but only if the BURST/PAGE signal is active and there is no operation of modification of the content of the memory bank 1A taking place (signal MODIFA deactivated). If an operation of modification of the content of the memory bank 1A is taking place (signal MODIFA active), the signal INCA is generated in synchrony with an internal clock signal INTCK, generated by a logic circuit for controlling the algorithms for modification of the memory content, for example by the block 2 in FIG. 1. Similarly, with the control on the signal MODIFB, a signal INCB is generated which determines the incrementation of the internal address 5B by the counter 4B. As for the signal INCA, the signal INCB is generated in synchrony with the signal CK if the BURST/PAGE signal is active and there is no operation of modification of the content of the bank 1B taking place (signal MODIFB deactivated); if, instead, the signal MODIFB is active, the signal INCB is generated in synchrony with the internal clock signal INTCK.

With reference to FIG. 5, there is shown the generation of the signals 21A, 21B, 22A, 22B, LOADA, LOADB for the control of the read circuits of the two memory banks in the burst read or page read mode. The external clock signal CK is used as a time base for the reading of the memory, therefore for the generation of the signals 21A, 21B, 22A, 22B, LOADA, LOADB, through suitable delays T. The activation of the signals 21A, 21B, LOADA, LOADB, are conditioned by the signal for selection of the respective memory bank (BANKA or BANKB), and by the fact that the respective memory bank is not at the moment occupied in an operation of modification of its own content (signals MODIFA, MODIFB). The signals 22A, 22B are further generated from the less significant address signals LSB (ADD), by scanning in synchrony with the external clock signal CK all the possible combinations of said signals, so that the multiplexers 18A, 18B supply at the output, in sequence, the outputs of the read circuits 17A, 17B.

Assuming that on the bank 1A an operation of modification of its content is being carried out, for example an erasure operation (bank 1A in erase mode), and at the same time it is desired to access the memory 1 in order to carry out a burst mode read. Since the memory bank 1A is busy in the operation of modification of its own content, the signal MODIFA is activated.

The control circuit 2, which controls the progress of the programming and erasure operations, will control through the (group of) control signal(s) 3A the progress of the operation of erasure of the bank 1A.

To the memory 1 there is supplied on the signals ADD an initial address, and the signal AD is activated. Moreover, the external clock signal CK is supplied. The presence of the signal CK and the activation of the signal AD determines, from the block 15 in FIG. 2, the activation of the BURST/PAGE signal, while the block 12 in FIG. 2, decoding the subset MSB(ADD) of the address signals ADD, determines the memory bank in which the burst mode read is to be carried out and consequently activates one of the signals BANKA, BANKB.

If the address present on the signals ADD corresponds to a memory location of the bank 1A, the signal BANKA is activated. However, as shown in FIGS. 4 and 5, the simultaneous activation of the signal MODIFA will prevent the block 6 for control of the burst mode read or page mode read operations from assuming control of the address counter 4A and of the read circuits S1A associated with the bank 1A. The burst mode read will not therefore be able to be carried out as long as the bank 1A is busy in the operation of modification of its own content.

If, instead, the address present on the signals ADD corresponds to a memory location of the bank 1B, which is not busy in the operation of modification of its own content and is therefore available for read access, the signal BANKB is activated, the activation of which, in combination with the activation of the signal AD and the inactive state of the signal MODIFB, determines the activation of the signal ADB. In the address counter 4B there is therefore loaded the address currently present on the signals ADD, constituting the address of the memory location from which to initiate the burst mode read. Said address is supplied to the selection block 9B, which selects the memory location of the bank 1B to be read. The reading takes place in parallel on several locations of the bank 1B constituting a page, by means of the read circuits 17B. By means of the multiplexer 18B, the content of the plurality of locations read in parallel is supplied in succession, synchronously with the clock signal CK, to the latch bank 19B and therefore to the output circuits 11 of the memory 1, to be placed on the external data bus DAT. In synchrony with the clock signal CK, the address counter 4B increments the internal address 5B which is supplied to the selection block 9B, so as to access the successive memory page, and so on until the end of the burst mode read.

Owing to the presence of the two address counters 4A, 4B, and of two independent read circuits S1A, S1B for each memory bank, the address counter 4B and the read circuits S1B of the bank 1B are used for the burst mode read or page mode read, while the address counter 4A and the read circuits S1A of the bank 1A can be utilized for the operations of verifying the erasure (or programming) of the content of the bank 1A.

The memory according to the invention has the advantage of permitting, during the background execution of an operation of modification, for example erasure or programming, on a memory bank, rapid access in burst mode or page mode to the other memory bank (faster access than that which would occur with a standard read), without having to wait for the completion of the erasure or programming of the other bank, or having to execute a command for suspension of the erasure.

Obviously, the memory 1 can also operate in standard mode reading of a memory bank while in the background an operation of modification of the content of the other bank is taking place: in this case, the address signals ADD coming from outside will be loaded in the address counters 4A, 4B on activation of the signals ADA, ADB, and will therefore be supplied to the selection circuits 9A, 9B of the memory bank. Obviously, in the case of a standard read, the signals INCA, INCB will not be generated, therefore the address counters 4A, 4B will not increment the address; the reading will thus be limited to a single memory location.

It is clear that variants or additions may be made to what has been described and illustrated above, without thereby departing from the scope of the present invention defined in the appended claims.

What is claimed is:

1. An electrically alterable semiconductor nonvolatile memory, comprising:

first and second memory banks;

an alteration control circuit coupled to the memory banks and structured to control alteration of information stored in the memory banks;

a read control circuit coupled to the memory banks and structured to control reading of information stored in the memory banks;

a first scanning circuit coupled to the first memory bank, the alteration control circuit, and the read control circuit and structured to select a plurality of memory locations in the first memory bank based on a received first address signal;

a second scanning circuit coupled to the second memory bank, the alteration control circuit, and the read control circuit and structured to select a plurality of memory locations in the second memory bank based on a received second address signal; and a memory control circuit coupled to the alteration and read control circuits and structured to cause the read control circuit to read information in parallel from plural memory locations from one of the memory banks simultaneously with the alteration control circuit altering information stored in the other one of the memory banks.

2. The memory of claim 1, further comprising first and second reading circuits coupled to the first and second memory banks, respectively, and to the read control circuit, the reading circuits being structured to operate simultaneously and independently of one another to read from the first and second memory banks simultaneously.

3. The memory of claim 1, wherein the read control circuit includes logic that controls the loading of the address signals into the scanning circuits and logic that determines whether a single memory location of one of the memory banks should be read or whether plural memory locations of the memory banks should be read in parallel.

4. The memory of claim 1, further comprising a memory control circuit coupled to the read and alteration control circuits and structured to control the read and alteration control circuits based on external command signals received by the memory.

5. The memory of claim 4 wherein the memory control circuit includes:

a decoder structured to determine to which of the first and second memory banks an address signal is directed and transmit to the read control circuit information indicating which memory bank is selected; and a mode selector that determines whether a parallel read of plural memory locations is being requested and transmits to the read control circuit a burst/page signal that causes the read control circuit to activate the scanning circuit coupled to the selected memory bank.

6. The memory of claim 1, wherein the memory control circuit is structured to cause the read control circuit to read information in a burst mode.

7. The memory of claim 1, wherein the memory control circuit is structured to cause the read control circuit to read information in a page mode.

8. A method of controlling a non-volatile memory that includes first and second memory banks, the method comprising:

writing information into the first memory bank;

performing a parallel read of plural memory locations of the second memory bank simultaneously with writing the information into the first memory bank;

controlling writing information and reading memory locations based on external command signals received by the memory;

determining to which of the first and second memory banks an address signal is directed;

transmitting information indicating which memory bank is selected;

determining whether a parallel read of plural memory locations is being requested; and transmitting a burst/page signal.

9. The method of claim 8, further comprising:

scanning memory locations of each of the first and second memory banks.

10. The method of claim 9, further comprising:

loading an external address to the second memory bank, said address identifying an initial memory location of the parallel read of plural memory locations; and successively scanning the memory locations contiguous with said initial memory location.

11. The method of claim 8, further comprising:

reading from the first and second memory banks simultaneously.

12. The method of claim 8, further comprising:

determining whether a single memory location of one of the memory banks should be read or whether plural memory locations of the memory banks should be read in parallel.

13. The method of claim 8, wherein performing a parallel read comprises:

performing a burst mode read.

14. The method of claim 8, wherein performing a parallel read comprises:

performing a page mode read.

15. A method of controlling a non-volatile memory that includes first and second memory banks, the method comprising:

writing information into the first memory bank;

performing a parallel read of plural memory locations of the second memory bank simultaneously with writing the information into the first memory bank;

loading an external address to the second memory bank, said address identifying an initial memory location of the parallel read of plural memory locations; and successively scanning the memory locations contiguous with said initial memory location; and generating signals to control the selective execution of writing information into the first memory bank, said signals inhibiting the parallel read of plural memory locations of the second memory bank.

* * * * *

UNITED STATES PATENT AND TRADEMARK OFFICE

CERTIFICATE OF CORRECTION

PATENT NO. : 6,912,598 B1
DATED : June 28, 2005
INVENTOR(S) : Lorenzo Bedarida et al.

It is certified that error appears in the above-identified patent and that said Letters Patent is hereby corrected as shown below:

Title page,
Item [73], Assignee, should read as -- STMicroelectronics, S.r.l. --.

Column 6,
Lines 62 and 63, "nonvolatile memory," should read as -- non-volatile memory, --.

Signed and Sealed this

Sixth Day of September, 2005

JON W. DUDAS
*Director of the United States Patent and Trademark Office*